(12) United States Patent
Jayaraman et al.

(10) Patent No.: US 9,461,186 B2
(45) Date of Patent: Oct. 4, 2016

(54) BACK CONTACT FOR A PHOTOVOLTAIC MODULE

(75) Inventors: Sreenivas Jayaraman, Perrysburg, OH (US); Oleh P. Karpenko, Perrysburg, OH (US)

(73) Assignee: FIRST SOLAR, INC., Perrysburg, OH (US)

( * ) Notice: Subject to any disclaimer, the term of this patent is extended or adjusted under 35 U.S.C. 154(b) by 910 days.

(21) Appl. No.: 13/183,209

(22) Filed: Jul. 14, 2011

(65) Prior Publication Data

US 2012/0012151 A1    Jan. 19, 2012

(51) Int. Cl.
*H01L 31/05* (2014.01)
*H01L 31/0224* (2006.01)
*H01L 31/18* (2006.01)
*H01L 31/073* (2012.01)
*H01L 31/0749* (2012.01)

(52) U.S. Cl.
CPC ..... *H01L 31/022425* (2013.01); *H01L 31/073* (2013.01); *H01L 31/0749* (2013.01); *H01L 31/18* (2013.01); *H01L 31/1864* (2013.01); *Y02E 10/541* (2013.01); *Y02E 10/543* (2013.01); *Y02P 70/521* (2015.11)

(58) Field of Classification Search
CPC ................. H01L 31/02244; H01L 31/1864; H01L 31/186; H01L 31/18; H01L 31/0322; H01L 31/022441
See application file for complete search history.

(56) References Cited

U.S. PATENT DOCUMENTS

| | | | |
|---|---|---|---|
| 3,386,009 A * | 5/1968 | Grabbe | 361/774 |
| 3,492,167 A | 1/1970 | Nakayama | |
| 3,581,386 A | 6/1971 | Dale | |
| 3,736,180 A | 5/1973 | Fischer | |
| 3,956,765 A | 5/1976 | Fischer | |
| 3,990,097 A | 11/1976 | Lindmayer | |
| 4,062,102 A | 12/1977 | Lawrence | |
| 4,320,251 A | 3/1982 | Narasimhan | |
| 4,392,451 A * | 7/1983 | Mickelsen et al. | 118/690 |
| 4,492,813 A | 1/1985 | Kausche | |
| 4,511,756 A | 4/1985 | Moeller | |
| 4,666,569 A | 5/1987 | Basol | |
| 4,703,553 A | 11/1987 | Mardesich | |
| 4,915,745 A | 4/1990 | Pollock | |
| 5,011,567 A | 4/1991 | Gonsiorawski | |
| 5,057,163 A | 10/1991 | Barnett | |
| 5,118,362 A | 6/1992 | St. Angelo | |
| 5,151,377 A | 9/1992 | Hanoka | |
| 5,178,685 A | 1/1993 | Borenstein | |
| 5,474,939 A | 12/1995 | Pollock | |
| 5,510,271 A | 4/1996 | Rohatgi | |
| 6,251,701 B1 * | 6/2001 | McCandless | 438/95 |

(Continued)

FOREIGN PATENT DOCUMENTS

| WO | WO 2009001389 A1 * | 12/2008 |
|---|---|---|
| WO | WO2010042981 A1 | 4/2010 |
| WO | WO2010141455 A1 | 12/2010 |

OTHER PUBLICATIONS

Pennebaker, "Hillock Growth and Stress Relief in Sputtered Au Films", Journal of Applied Physics, 1969, vol. 40, pp. 394-400.*

(Continued)

*Primary Examiner* — Marla D McConnell
(74) *Attorney, Agent, or Firm* — Blank Rome LLP (57) ABSTRACT

The present invention relates to photovoltaic modules and methods of manufacturing photovoltaic modules.

13 Claims, 4 Drawing Sheets

(56) References Cited

U.S. PATENT DOCUMENTS

| | | |
|---|---|---|
| 6,258,620 B1 | 7/2001 | Morel |
| 6,423,568 B1 | 7/2002 | Verlinden |
| 7,339,110 B1 | 3/2008 | Mulligan |
| 2003/0011047 A1* | 1/2003 | Cunningham .... H01L 31/02168 257/614 |
| 2003/0044539 A1* | 3/2003 | Oswald ................. 427/404 |
| 2003/0180983 A1* | 9/2003 | Oswald ............... H01L 31/18 438/57 |
| 2004/0063320 A1 | 4/2004 | Hollars |
| 2007/0277874 A1 | 12/2007 | Dawson |
| 2008/0110498 A1 | 5/2008 | Zafar |
| 2008/0128020 A1* | 6/2008 | Zafar et al. ............. 136/252 |
| 2008/0216893 A1 | 9/2008 | Russell |
| 2009/0194153 A1 | 8/2009 | Halali |
| 2009/0308454 A1 | 12/2009 | Korevaar |
| 2010/0139758 A1 | 6/2010 | Chang |
| 2010/0154872 A1 | 6/2010 | Jun |
| 2010/0180935 A1 | 7/2010 | Chen |
| 2010/0229928 A1 | 9/2010 | Zuniga |
| 2010/0243044 A1 | 9/2010 | Chang |
| 2010/0255660 A1 | 10/2010 | Singh |
| 2010/0307561 A1 | 12/2010 | Buller |
| 2010/0307568 A1 | 12/2010 | Chen |
| 2011/0017283 A1 | 1/2011 | Kampmann |
| 2011/0041911 A1 | 2/2011 | Lee |
| 2011/0045627 A1 | 2/2011 | Sachs |
| 2011/0100447 A1 | 5/2011 | Korevaar |
| 2011/0143489 A1 | 6/2011 | Korevaar |

OTHER PUBLICATIONS

McCandless, et al, "Correlation of surface phases with electrical behavior in thin-film CdTe devices" Thin Solid Films, 2003, p. 249-256.*

Batzner, et al, "A study of the back contacts on CdTe/CdS solar cells" Thin Solid Films, 2000, p. 463-467.*

McCandless, et al "Processing options for CdTe thin film solar cells" Solar Energy, 2004, p. 839-856.*

Zhou, et al "The formation of different phases of $Cu_xTe$ and their effects on CdTe/CdS solar cells" Thin Solid Films, 2007, p. 7364-7369.*

Potlog, et al "Photovoltaic minimodule based on CdTe" Moldovian Journal of the Physical Sciences 2006, p. 171-175.*

* cited by examiner

BACK CONTACT FOR A PHOTOVOLTAIC MODULE

CLAIM OF PRIORITY

This application claims priority under 35 U.S.C. §119(e) to U.S. Provisional Patent Application Ser. No. 61/364,664 filed on Jul. 15, 2010, which is hereby incorporated by reference in its entirety.

TECHNICAL FIELD

The present invention relates to photovoltaic modules and methods of manufacturing photovoltaic modules.

BACKGROUND

A photovoltaic device may include a semiconductor material deposited over a substrate. The semiconductor may contain a first layer serving as a window layer and a second layer serving as an absorber layer. The semiconductor window layer may allow solar radiation to reach the absorber layer, and the absorber layer, which may contain cadmium telluride, may convert the solar radiation to electricity. The photovoltaic device may also include a back contact to facilitate connectivity. However, the back contact contributes electrical resistance to the photovoltaic device which reduces the device's overall efficiency.

DETAILED DESCRIPTION

A photovoltaic device may include an optically transparent substrate, a transparent conductive oxide layer adjacent to the substrate, and a semiconductor material adjacent to the transparent conductive oxide layer. In addition, one or more metal layers may be deposited on a back surface of the semiconductor material to form a back contact. With the transparent conductive oxide layer acting as a front contact, the front and back contacts may serve as electrodes for transporting photo-generated current away from the photovoltaic device.

The layers of semiconductor material may include a bi-layer, which may include an n-type semiconductor window layer, and a p-type semiconductor absorber layer. The n-type window layer and the p-type absorber layer may be positioned in contact with one another to form a p-n junction. As a result of diffusion across the junction, negative acceptor ions are formed on the p-type side and positive donor ions are formed on the n-type side. The presence of the ions creates a built-in electric field across the junction. When a photon is absorbed within the p-n junction, an electron hole pair is formed. The electrons are then swept towards the n-type layer and holes are swept towards the p-type layer. Electrons can then flow back to the p-type side via an external current path. The resulting electron flow provides current, which combined with the resulting voltage from the electric field, creates power. The result is a conversion of photon energy into electrical power.

The transparent conductive oxide layer may be deposited between the substrate and the semiconductor bi-layer to serve as a front contact. The transparent conductive oxide layer may include, for example, cadmium stannate, since it exhibits high optical transmission and low electrical resistance. The transparent conductive oxide may be part of a three-layer stack. For instance, the transparent conductive oxide stack may include a bather layer, a transparent conductive oxide layer, and a buffer layer. The buffer layer may be included between the transparent conductive oxide layer and the semiconductor window layer to decrease the likelihood of irregularities occurring during the formation of the semiconductor window layer. Also, the barrier layer can be incorporated between the substrate and the transparent conductive oxide layer to lessen diffusion of sodium or other contaminants from the substrate to the semiconductor layers, which could result in poor performance and degradation of the photovoltaic devices. The barrier layer may include, for example, silicon dioxide.

The back contact layer may transport electrical charge away from the device and may include one or more metal layers deposited adjacent to the semiconductor absorber layer. In particular, the back contact may include a first metal layer deposited adjacent to the semiconductor absorber layer. The first metal layer may be deposited using any suitable process or combination of processes. For instance, the first metal layer may be deposited by physical vapor deposition techniques such as magnetron sputtering, thermal evaporation or laser ablation. Alternate methods of depositing a first layer may include chemical vapor deposition, wet methods such as electrochemical or electroless deposition, or even mechanical roll coating. After the first metal layer is deposited, it may be heat treated to alter its physical and electrical properties. During the deposition process, nitrogen may be introduced into the back contact metal to improve the overall efficiency of the photovoltaic device. The second metal layer may be deposited by physical vapor deposition, electrochemical or electroless deposition, chemical vapor deposition, mechanical roll coating, or a combination thereof.

A variety of materials are available for the first and second metal layers, including molybdenum, aluminum, chromium, iron, nickel, titanium, vanadium, manganese, cobalt, zinc, ruthenium, tungsten, silver, gold, copper, mercury tellurium, titanium disilicide, titanium silicide, molybdenum nitride, titanium nitride, tungsten nitride and platinum. Molybdenum nitride functions particularly well as a back contact metal due to its relative stability at processing temperatures and low contact resistance. Similarly, silver, gold, and copper function well as back contact metals since they are low-resistance electrical conductors.

The heat treating process may include annealing or any other suitable heat treating process. Post-deposition annealing of the first metal layer may relieve stress as well as induce desirable reactions between the metal and the semiconductor layer. Post-deposition annealing may also transform the metal layer to form a desirable metallurgical phase.

For instance, annealing may reduce the contact resistance of the first metal layer. Contact resistance is defined as a contribution to the total resistance of a device resulting from electrical leads and connections. By reducing the contact resistance, the overall efficiency of the photovoltaic device may be increased.

When heat treating the back contact, high temperatures may be desirable to cause inter-diffusion between the semiconductor absorber layer and the first metal layer. High temperatures may also be desirable to transform the first metal layer to a desired phase. However, to prevent dopant redistribution, the thermal budget should be carefully controlled. Thermal budget is defined as the cumulative thermal energy imparted to the photovoltaic panel by all thermal processing steps during manufacturing. If high temperatures are required during manufacturing, a moderate thermal budget may be achieved by limiting the duration of the process. Similarly, if a process requires significant time to complete, the temperature must be reduced to avoid an excessive thermal budget.

While a high temperature may be desirable when forming the first metal layer of the back contact, the temperature must be controlled to avoid reducing the integrity of the photovoltaic device. In particular, the layers of metal used to create the back contact may have coefficients of thermal expansion that differ from those of the semiconductor, TCO, and substrate layers. Adding heat to layers having differing coefficients of thermal expansion may induce strain that can result in cracking or even gross delamination of the layers. Accordingly, excessive heat treatment temperatures and durations should be avoided.

To produce a reliable back contact, the semiconductor surface should be extremely clean prior to forming the back contact layer adjacent to the semiconductor surface. Under certain conditions, unwanted oxides may form on the semiconductor surface. Before a first metal layer can be deposited on the semiconductor, the oxides must be removed. Surface cleaning may be performed by sputter-etching, chemical etching, reactive gas etching, ion milling, or any other suitable process.

In one aspect, a photovoltaic module may include a substrate, a transparent conductive oxide layer adjacent to the substrate, a semiconductor layer adjacent to the transparent conductive oxide layer, and a back contact layer adjacent to the semiconductor layer. The back contact layer may include a first metal layer formed adjacent to the substrate layer and a second metal layer formed adjacent to the first metal layer. In particular, the first metal layer may include a material selected from the group consisting of molybdenum, tungsten, nickel, cobalt, titanium, molybdenum nitride, titanium nitride, tungsten nitride and mercury tellurium. The first metal layer may be heat treated at a temperature of about 100 C to about 400 C for a duration of about 30 seconds to about 30 minutes. Preferably, the first metal layer may be heat treated at a temperature of about 200 C to about 300 C for a duration of about 1 minute to about 20 minutes. The first metal layer may have a thickness of about 5 angstroms to about 300 angstroms. Preferably, the first metal layer may have a thickness of about 50 angstroms to about 250 angstroms. The second metal layer may include a material selected from the group consisting of silver, gold, copper, and aluminum and may be heat treated at a temperature of about 50 C to about 400 C for a duration of about 1 minute to about 30 minutes. Preferably, the second metal layer may be heat treated at a temperature of about 50 C to about 150 C for a duration of about 5 minutes to about 20 minutes. The second metal layer may have a thickness of about 500 angstroms to about 10000 angstroms. Preferably, the second metal layer may have a thickness of about 1000 angstroms to about 5000 angstroms.

In another aspect, a method of manufacturing a photovoltaic device may include providing a substrate, forming a transparent conductive oxide layer adjacent to the substrate, forming a semiconductor layer adjacent to the transparent conductive oxide layer, and forming a back contact layer adjacent to the semiconductor layer. The step of forming a back contact layer may include forming a first metal layer adjacent to the substrate layer, heat treating the first metal layer, and forming a second metal layer adjacent to the first metal layer. The first metal layer may include a material selected from the group consisting of molybdenum, tungsten, nickel, cobalt, titanium, molybdenum nitride, titanium nitride, tungsten nitride, and mercury tellurium. The step of heat treating the first metal layer may include a temperature of about 100 C to about 400 C for a duration of about 30 seconds to about 30 minutes. Preferably, the heat treating process may occur at a temperature of about 200 C to about 300 C for a duration of about 1 minute to about 20 minutes. The first metal layer may have a thickness of about 5 angstroms to about 300 angstroms. Preferably, the first metal layer may have a thickness of about 50 angstroms to about 250 angstroms. The step of forming a back contact may include applying a second metal layer. The second metal layer may include a material selected from the group consisting of silver, gold, copper, and aluminum. The second metal layer may have a thickness of about 500 angstroms to about 10000 angstroms. Preferably, the second metal layer may have a thickness of about 1000 angstroms to about 5000 angstroms. The second metal layer may or may not require the application of a thermal treatment.

In another aspect, a photovoltaic module can include a plurality of photovoltaic cells adjacent to a substrate and a back cover adjacent to the plurality of photovoltaic cells. Each one of the plurality of photovoltaic cells can include a transparent conductive oxide layer adjacent to the substrate, a semiconductor layer adjacent to the transparent conductive oxide layer, and a back contact layer adjacent to the semiconductor layer. The back contact layer can include a first metal layer formed adjacent to the semiconductor layer and a second metal layer formed adjacent to the first metal layer. The first metal layer can include a material including molybdenum, tungsten, nickel, cobalt, titanium, molybdenum nitride, titanium nitride, tungsten nitride, or mercury tellurium. The first metal layer can have a thickness of about 5 angstroms to about 300 angstroms. The second metal layer can include a material selected from the group consisting of silver, gold, copper, and aluminum. The second metal layer can have a thickness of about 500 angstroms to about 10000 angstroms.

In another aspect, a method for generating electricity can include illuminating a photovoltaic cell with a beam of light to generate a photocurrent and collecting the generated photocurrent. The photovoltaic cell can include a substrate, a transparent conductive oxide layer adjacent to the substrate, a semiconductor layer adjacent to the transparent conductive oxide layer, and a back contact layer adjacent to the semiconductor layer. The back contact layer can include a first metal layer formed adjacent to the semiconductor layer a second metal layer formed adjacent to the first metal layer.

Figure 1:
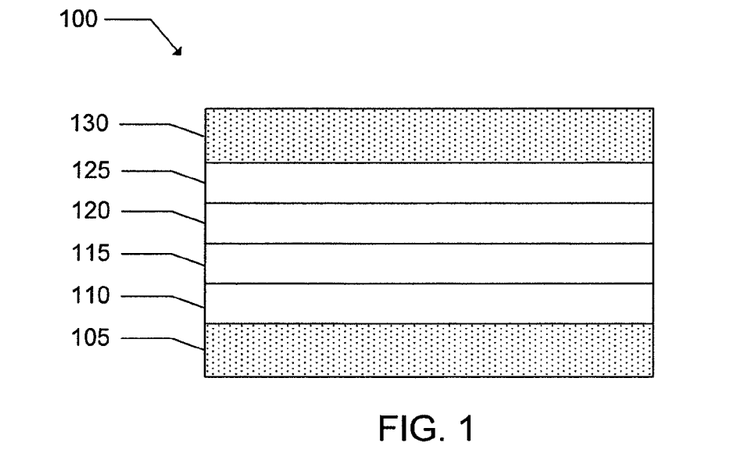
FIG. 1 is a side view of a photovoltaic device.

As shown in FIG. 1, a photovoltaic device 100 may include a substrate 105, a transparent conductive oxide stack 110, a semiconductor bi-layer including a semiconductor window layer 115 and a semiconductor absorber layer 120, a back contact layer 125, and a back support 130. The substrate 105 may include an optically transparent material, such as soda-lime glass. However, since the primary function of the substrate 105 is to protect the device from physical damage caused by moisture or debris while permitting penetration of solar radiation, any suitable transparent material may be used. Similar to the substrate 105, the back support 130 may serve to protect and enclose the photovoltaic device 100. The back support 130 may be any suitable material, such as soda-lime glass.

Figure 2:
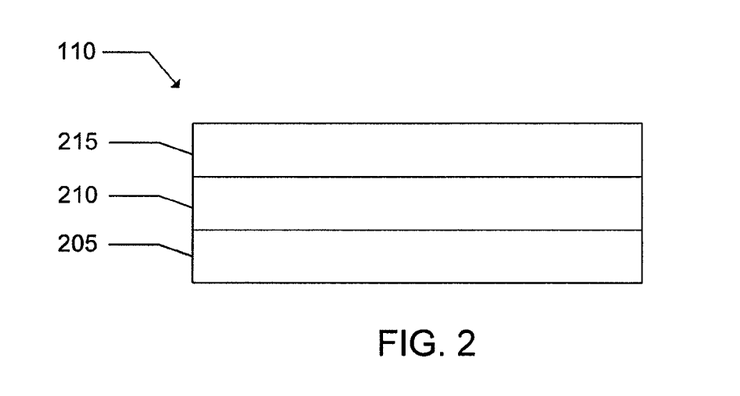
FIG. 2 is a side view of a transparent conductive oxide stack.

As shown in FIG. 2, a transparent conductive oxide stack 110 may include a barrier layer 205, a transparent conductive oxide layer 210, and a buffer layer 215. The barrier layer 205 may be formed adjacent to the substrate 105. One or more barrier layers 205 may include any suitable material, including, for example, a silicon oxide, aluminum-doped silicon oxide, boron-doped silicon oxide, phosphorous-doped silicon oxide, silicon nitride, aluminum-doped silicon nitride, boron-doped silicon nitride, phosphorous-doped silicon nitride, silicon oxide-nitride, titanium oxide, niobium oxide, tantalum oxide, aluminum oxide, zirconium oxide, tin oxide, or combinations thereof. The transparent conductive oxide layer 210 may be formed adjacent to the barrier layer 205 and may include any suitable material. For instance, the transparent conductive oxide layer 210 may include cadmium stannate. Alternately, the transparent conductive oxide layer 210 may include any suitable material or materials. For instance, the transparent conductive oxide layer 210 may include a layer of cadmium and tin and may be any suitable thickness. The transparent conductive oxide layer 210 may have a thickness ranging from, for example, 100 to 1000 nm. The transparent conductive oxide stack 110 may also include a buffer layer 215 which may be formed adjacent to the transparent conductive oxide layer 210. The presence of the buffer layer 215 during manufacturing may decrease the likelihood of irregularities occurring during the formation of the semiconductor window layer 115. The transparent conductive oxide stack 110 may be manufactured using a variety of deposition techniques, including, for example, low pressure chemical vapor deposition, atmospheric pressure chemical vapor deposition, plasma-enhanced chemical vapor deposition, thermal chemical vapor deposition, DC or AC sputtering, spin-on deposition, or spray-pyrolysis. Each deposition layer can be of any suitable thickness, for example, in the range of about 10 to about 5000 angstroms.

The semiconductor window layer 115 may be formed adjacent to the transparent conductive oxide stack 110. The semiconductor absorber layer 120 may formed adjacent to the semiconductor window layer 115. Together, the semiconductor window layer 115 and the semiconductor absorber layer 120 form a semiconductor bi-layer. The semiconductor bi-layer may include cadmium telluride (CdTe). Alternately, the semiconductor bi-layer may include any suitable compound, such as copper indium gallium selenide (CIGS). The window layer 115 may be an n-type semiconductor window layer, and the absorber layer 120 may be a p-type semiconductor absorber layer. The n-type window layer 115 and the p-type absorber layer 120 may be positioned in contact with one another to create an electric field.

Figure 3:
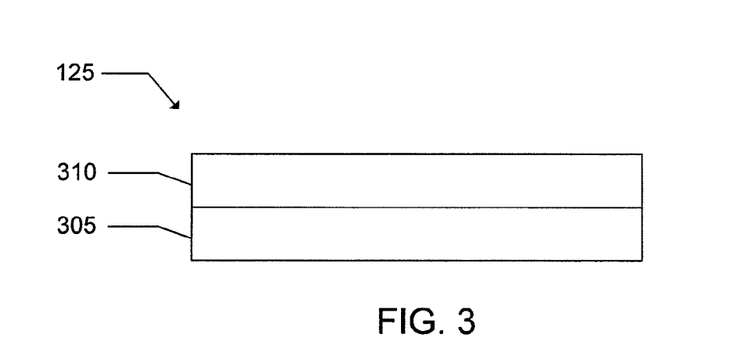
FIG. 3 is a side view of a back contact.

The back contact layer 125 may be formed adjacent to the semiconductor absorber layer 120. The back contact layer 125 may cover a portion or an entire surface of the semiconductor absorber layer 120. As shown in FIG. 3, the back contact layer 125 may include a first metal layer 305 and a second metal layer 310. The first metal layer may be adjacent to the semiconductor absorber layer 120, and the second metal layer 310 may be adjacent to the first metal layer 305. The first metal layer 305 may include a material selected from the group consisting of molybdenum, aluminum, chromium, iron, nickel, titanium, vanadium, manganese, cobalt, zinc, ruthenium, tungsten, silver, gold, copper, mercury tellurium, titanium disilicide, titanium silicide, molybdenum nitride, titanium nitride, tungsten nitride, and platinum or a combination thereof. Alternately, any suitable material may be used. The first metal layer 305 may have a thickness ranging from 5 angstroms to 300 angstroms. Preferably, the first metal layer may have a thickness ranging from 50 to 250 angstroms.

The first metal layer 305 may be heat treated to alter, for instance, its electrical and mechanical properties. The heat treating of the first metal layer 305 may include annealing and may result in the formation of an ohmic contact between, for example, the cadmium telluride semiconductor and the first metal layer 305. The annealing may occur in the presence of a gas such as, for example, nitrogen gas selected to control the atmosphere of the annealing process. The annealing may be aided by providing an oxygen-depleting or oxygen-reducing environment. The first metal layer 305 may be annealed under any suitable pressure, for example, under reduced pressure at about 0.01 Pa (10-4 Torr). Also, the first metal layer 305 may be annealed at any suitable temperature or temperature range. For example, the first metal layer 305 may be annealed at about 100 to about 400 C. Preferably, the first metal layer 305 may be annealed at about 200 to about 300 C. In addition, the first metal layer 305 may be annealed for any suitable duration. For example, the first metal layer 305 may be annealed for a duration ranging from about 30 seconds to about 30 minutes. Preferably, the first metal layer 305 may be annealed for a duration ranging from about 1 minute to about 20 minutes. By annealing the first metal layer 305 at a high temperature, inter-diffusion may occur between the semiconductor absorber layer 120 and the first metal layer 305. The first metal layer 305 may be transformed into a metallurgical phase that affords low contact resistance to the semiconductor absorber layer 120. The selection of temperature and duration values must account for the physical limitations and properties of the various layers of the device 100. For instance, the thermal budget must be large enough to cause a reduction in contact resistance of the first metal layer 305, but the thermal budget must also be small enough to avoid degrading the other layers (e.g. 110,115, 120).

Once the first metal layer 305 is deposited adjacent the semiconductor absorber layer 120, a second metal layer 310 may be deposited on the first metal layer 305. The second metal layer 310 may include a material selected from the group consisting of molybdenum, aluminum, chromium, iron, nickel, titanium, vanadium, manganese, cobalt, zinc, ruthenium, tungsten, silver, gold, copper, mercury tellurium, titanium disilicide, titanium silicide, molybdenum nitride, titanium nitride, tungsten nitride, and platinum or a combination thereof. Alternately, any suitable material may be used. Similar to the first metal layer, the second metal layer 310 may be heat treated to improve its electrical and mechanical properties. In particular, the second metal layer 310 may be heat treated to improve adhesion to the first metal layer 305 and to reduce its electrical resistance. For instance, an annealing process may refine the microstructure of the second metal layer to improve its current carrying ability. The choice of temperature and duration values for the heat treatment process may be limited by the existing layers (e.g. 110, 115, 120, and 305). For instance, the temperature and duration values must be low enough to avoid degrading the existing layers or causing detrimental interactions amongst the layers (e.g. 110, 115, 120, and 305). Alternately, the heat treatment process may be omitted if the second metal layer 310 exhibits desirable physical and electrical properties.

Figure 4:
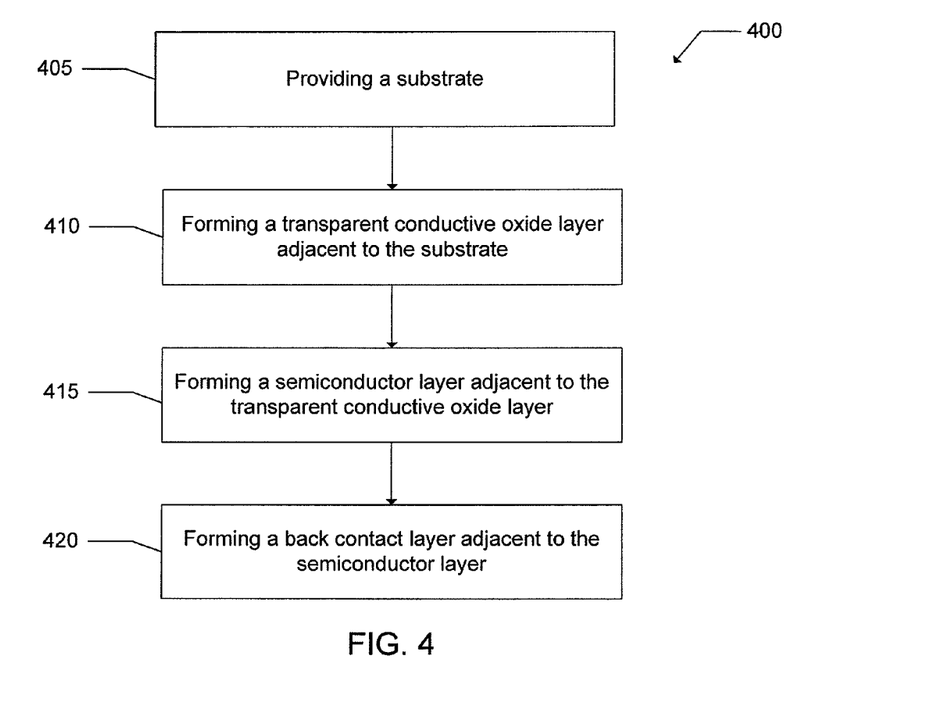
FIG. 4 is a method of manufacturing a photovoltaic device.
Figure 5:
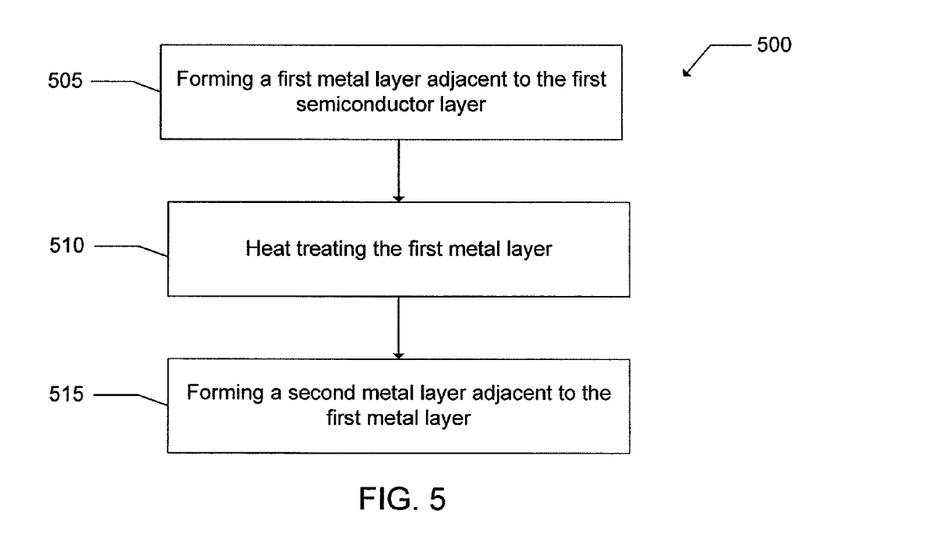
FIG. 5 is a method of manufacturing a back contact layer for a photovoltaic device.
Figure 6:
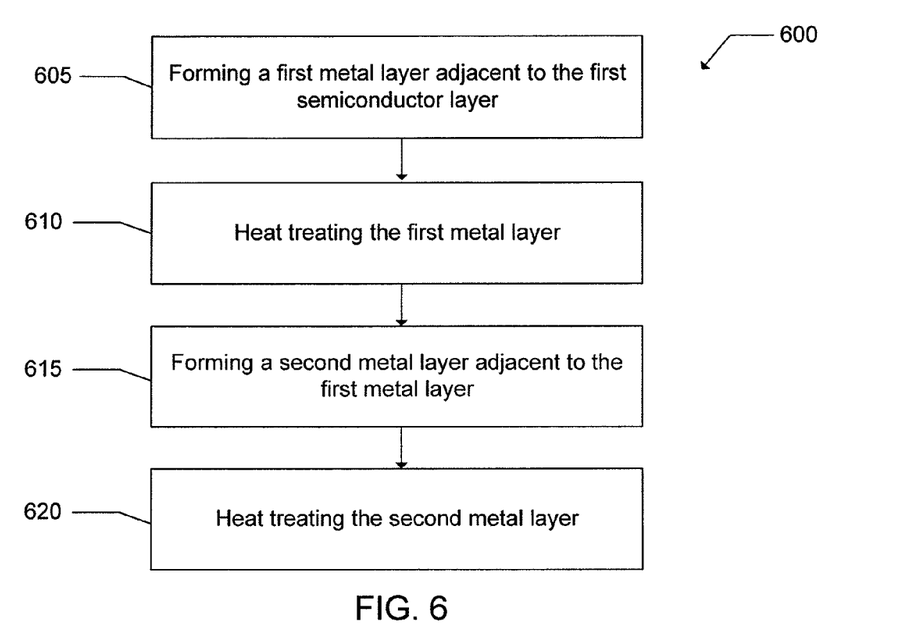
FIG. 6 is a method of manufacturing a back contact layer for a photovoltaic device.
Figure 7:
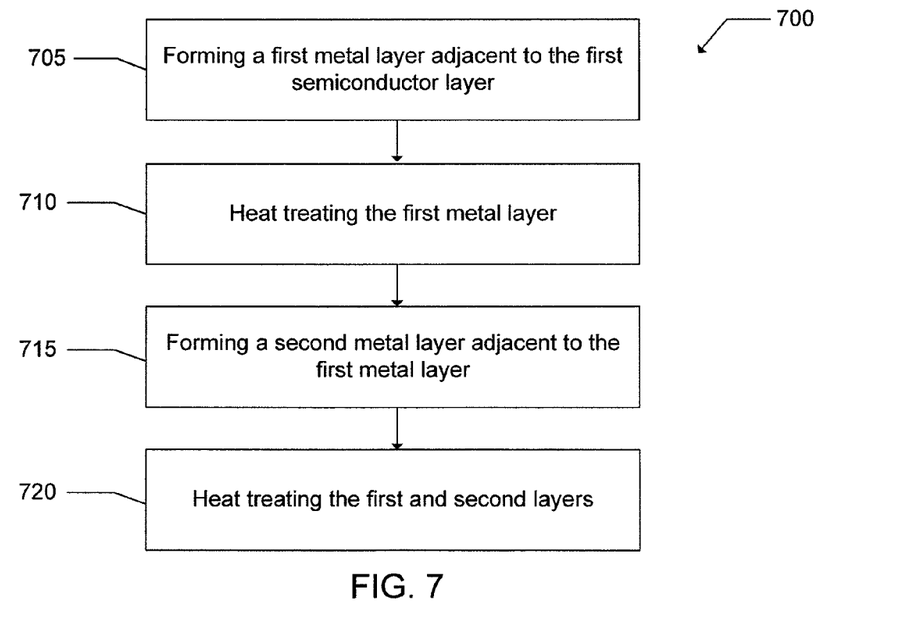
FIG. 7 is a method of manufacturing a back contact layer for a photovoltaic device.

As shown in FIG. 4, a method of manufacturing a photovoltaic device 100 may include providing a substrate 405, forming a transparent conductive oxide layer adjacent to the substrate 410, forming a semiconductor layer adjacent to the transparent conductive oxide 415, and forming a back contact layer 420 adjacent to the semiconductor layer. Forming a back contact layer 420 may be accomplished through methods described in FIGS. 5-10. In particular, as shown in FIG. 5, forming a back contact layer may include forming a first metal layer adjacent to the first semiconductor layer 505, heat treating the first metal layer 510, and forming a second metal layer adjacent to the first metal layer 515. As shown in FIG. 6, the method of FIG. 5 may include an additional step of heat treating the second metal layer 620. This step can be achieved by using an established technique like microwave heating to selectively heat a given layer. Alternately, as shown in FIG. 7, the method of FIG. 5 may include an additional step of heat treating both the first and second metal layers 720.

Figure 8:
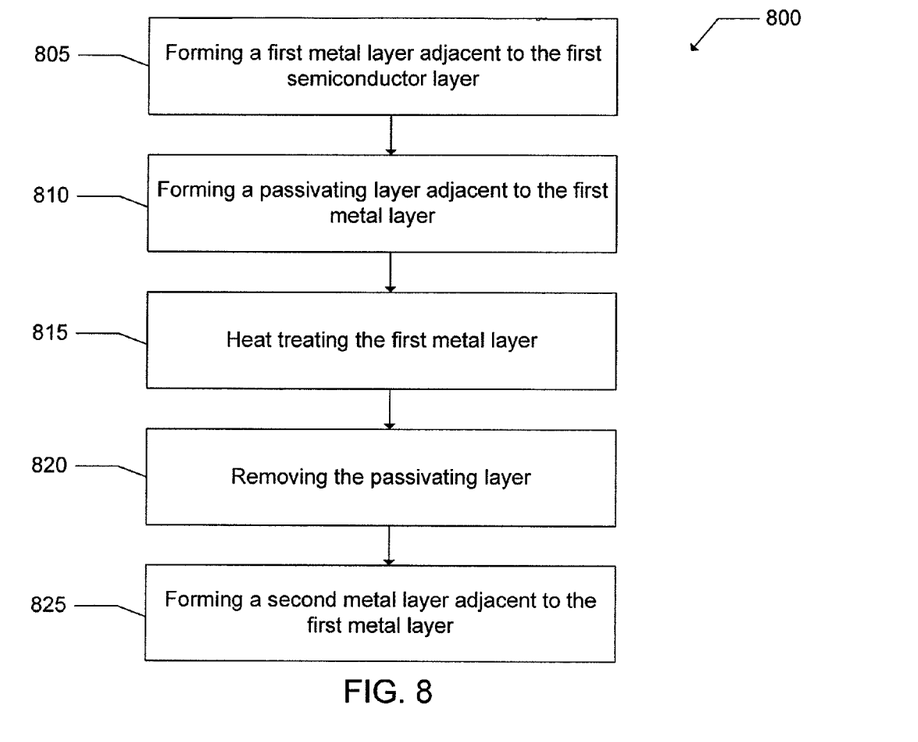
FIG. 8 is a method of manufacturing a back contact layer for a photovoltaic device.
Figure 9:
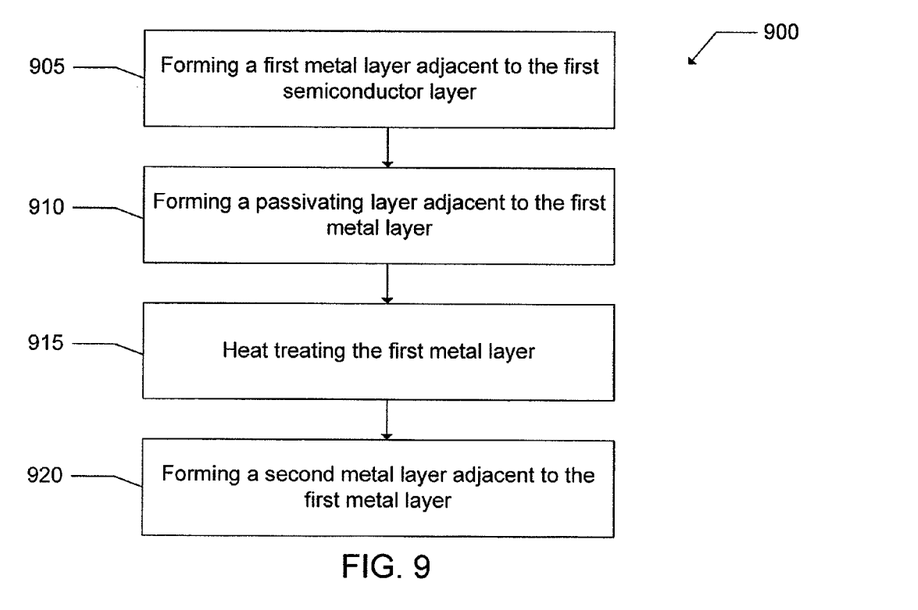
FIG. 9 is a method of manufacturing a back contact layer for a photovoltaic device.

Once the first metal layer 305 is deposited adjacent to the semiconductor absorber layer 120, a passivating layer (not shown) may be deposited adjacent the first layer 305. The passivating layer may cap the first metal layer 305 and protect against oxidation and grain boundary grooving prior to, during, and after the heat treating process. The passivating layer may be any suitable material. The passivating layer may be incorporated into the back contact layer, or it may be stripped via dry etching, wet chemical, or any other suitable process prior to forming the second metal layer 310. For example, as shown in FIG. 8, the method may include forming a first metal layer adjacent to the semiconductor layer 805, forming a passivating layer adjacent to the first metal layer 810, heat treating the first metal layer 815, removing the passivating layer 820, and forming a second metal layer adjacent to the first metal layer 825. The second metal layer may then be heat treated in a subsequent step. In addition, the step of removing the passivating layer may omitted as shown in the method of FIG. 9. In this way, the passivating layer may become a permanent component of the back contact layer.

Although the steps in the aforementioned methods are shown in particular orders in FIGS. 5-9, this is not limiting. For instance, the forming steps and heat treating steps may occur prior to forming the back contact layer adjacent to the semiconductor layer. Although only two layers are shown, the back contact layer 125 may include two or more layers. For instance, the back contact layer 125 may include two, three, four, five, or six layers. The additional layers may be formed in sequential steps similar to the two-part back contact described herein. The additional layers may be heat treated as described herein to improve their electrical and mechanical properties. In addition, subsequent layers may be formed and heat treated separately from the photovoltaic device to avoid high thermal budgets from adversely affecting the semiconductor bi-layer.

Details of one or more embodiments are set forth in the accompanying drawings and description. Other features, objects, and advantages will be apparent from the description, drawings, and claims. Although a number of embodiments of the invention have been described, it will be understood that various modifications may be made without departing from the spirit and scope of the invention. It should also be understood that the appended drawings are not necessarily to scale, presenting a somewhat simplified representation of various features illustrative of the basic principles of the invention.

What is claimed is:

1. A method for manufacturing a photovoltaic module, the method comprising:
    forming a semiconductor window layer over a substrate;
    forming a semiconductor absorber layer over the window layer, the semiconductor absorber layer comprising one of CdTe and CIGS;
    removing oxides from the absorber layer surface;
    forming a first metal layer in direct physical contact with the oxide removed surface of the absorber layer, the first metal layer comprising a material selected from the group consisting of molybdenum, tungsten, nickel, cobalt, titanium, molybdenum nitride, titanium nitride, tungsten nitride, mercury tellurium, or any combination thereof;
    heat treating the formed first metal layer;
    forming a capping passivating layer over the formed first metal layer prior to heat treating the formed metal layer; and
    forming a second metal layer over the heat treated first metal layer,
    wherein the capping passivating layer is removed from the first metal layer after heat treating the formed metal layer and before the forming of the second metal layer.

2. The method of claim 1, wherein the first metal layer comprises a material selected from the group consisting of molybdenum, molybdenum nitride, or any combination thereof.

3. The method of claim 1, wherein the step of heat treating the first metal layer comprises a temperature of about 100° C. to about 400° C. and a duration of about 30 seconds to about 30 minutes.

4. The method of claim 1, wherein the step of heat treating the first metal layer comprises a temperature of about 200° C. to about 300° C. and a duration of about 1 minute to about 20 minutes.

5. The method of claim 1, wherein the first metal layer has a thickness of about 5 angstroms to about 300 angstroms.

6. The method of claim 1, wherein the first metal layer has a thickness of about 50 angstroms to about 250 angstroms.

7. The method of claim 1, wherein the second metal layer comprises a material selected from the group consisting of aluminum, chromium, iron, vanadium, manganese, zinc, ruthenium, silver, gold, copper, platinum, tungsten, nickel, cobalt, titanium, molybdenum nitride, titanium disilicide, titanium silicide, titanium nitride, tungsten nitride, and mercury tellurium, or any combination thereof.

8. The method of claim 1, wherein the step of forming a back contact layer further comprises heat treating the second metal layer at a temperature of about 50° C. to about 400° C. for a duration of about 1 minute to about 30 minutes.

9. The method of claim 1, wherein the step of forming a back contact layer further comprises heat treating the second metal layer at a temperature of about 50° C. to about 150° C. for a duration of about 5 minutes to about 20 minutes.

10. The method of claim 1, wherein the second metal layer has a thickness of about 500 angstroms to about 10000 angstroms.

11. The method of claim 1, wherein the second metal layer has a thickness of about 1000 angstroms to about 5000 angstroms.

12. The method of claim 1, further comprising:
  cleaning a surface of the formed first metal layer before forming the second metal layer.

13. A method for manufacturing a photovoltaic module, the method comprising:
  forming a semiconductor window layer over a substrate;
  forming a semiconductor absorber layer over the window layer, the semiconductor absorber layer comprising one of CdTe and CIGS;
  removing oxides from the absorber layer surface;
  forming a first metal layer in direct physical contact with the oxide removed surface of the absorber layer;
  heat treating the formed first metal layer;
  forming a capping passivating layer over the formed first metal layer prior to the heat treating the formed metal layer; and
  forming a second metal layer over the heat treated first metal layer,
  wherein the capping passivating layer is removed from the first metal layer after heat treating the formed metal layer and before the forming of the second metal layer.

* * * * *

UNITED STATES PATENT AND TRADEMARK OFFICE
CERTIFICATE OF CORRECTION

PATENT NO. : 9,461,186 B2  
APPLICATION NO. : 13/183209  
DATED : October 4, 2016  
INVENTOR(S) : Sreenivas Jayaraman et al.

Page 1 of 1

It is certified that error appears in the above-identified patent and that said Letters Patent is hereby corrected as shown below:

On the Title Page

Please insert:
--(60) Related U.S. Application Data
Provisional application No. 61/364,664, filed on July 15, 2010--

Signed and Sealed this
Fourth Day of April, 2017

Michelle K. Lee
*Director of the United States Patent and Trademark Office*